(12) United States Patent
Ko et al.

(10) Patent No.: US 12,193,176 B2
(45) Date of Patent: Jan. 7, 2025

(54) DISPLAY APPARATUS AND METHOD FOR MANUFACTURING SAME

(71) Applicant: Samsung Display Co., Ltd., Yongin-si (KR)

(72) Inventors: Kyungrok Ko, Suwon-si (KR); Jingyu Sim, Suwon-si (KR); Byoung Jin Jin, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/890,821

(22) Filed: Aug. 18, 2022

(65) Prior Publication Data
US 2023/0209740 A1 Jun. 29, 2023

(30) Foreign Application Priority Data
Dec. 24, 2021 (KR) .................. 10-2021-0187496

(51) Int. Cl.
*H05K 5/02* (2006.01)
*G06F 1/16* (2006.01)

(52) U.S. Cl.
CPC ......... *H05K 5/0217* (2013.01); *G06F 1/1652* (2013.01)

(58) Field of Classification Search
CPC .................. H05K 5/0217; G06F 1/1652
See application file for complete search history.

(56) References Cited

U.S. PATENT DOCUMENTS

| | | | |
|---|---|---|---|
| 9,760,129 B2* | 9/2017 | Kim | G06F 1/1652 |
| 9,870,029 B2 | 1/2018 | Kim et al. | |
| 10,111,344 B2* | 10/2018 | Han | H05K 7/1427 |
| 10,254,797 B2* | 4/2019 | Lee | H10K 50/84 |
| 10,466,748 B2* | 11/2019 | Choi | G09F 9/301 |
| 10,701,813 B2* | 6/2020 | Kim | G06F 1/1652 |
| 10,750,625 B2 | 8/2020 | Park | |
| 11,803,211 B2* | 10/2023 | Li | G06F 1/1641 |
| 2014/0362512 A1* | 12/2014 | Hinson | G06F 1/1601 |
| | | | 361/679.21 |
| 2016/0029474 A1* | 1/2016 | Cho | B65H 75/28 |
| | | | 361/749 |
| 2016/0187929 A1* | 6/2016 | Kim | G06F 1/1643 |
| | | | 345/184 |

(Continued)

FOREIGN PATENT DOCUMENTS

| | | | |
|---|---|---|---|
| KR | 101570869 B1 | 11/2015 | |
| KR | 101649097 B1 | 8/2016 | |

(Continued)

*Primary Examiner* — Sagar Shrestha
(74) *Attorney, Agent, or Firm* — CANTOR COLBURN LLP

(57) ABSTRACT

A display apparatus includes a roller extending in a first direction and a display module coupled to the roller. The roller includes a cylinder body having an inner accommodation space, and the cylinder body defines a slot that exposes the inner accommodation space to the outside and extends in the first direction. An outer surface of the cylinder body includes a support surface spaced apart from an axis of the cylinder body by a first distance and a guide surface extended to or from the support surface and recessed a predetermined distance toward the axis such that a distance to the axis is less than the first distance. The guide surface is extended to or from a first end of the slot.

15 Claims, 15 Drawing Sheets

(56) References Cited

U.S. PATENT DOCUMENTS

| | | | | |
|---|---|---|---|---|
| 2016/0239052 A1* | 8/2016 | Kim | .................... | G06F 1/1656 |
| 2017/0318693 A1* | 11/2017 | Kim | .................... | H02K 11/21 |
| 2018/0198899 A1* | 7/2018 | Lee | .................... | G06F 1/1652 |
| 2019/0036067 A1* | 1/2019 | Kim | .................... | H05K 5/0017 |
| 2019/0150300 A1* | 5/2019 | Kim | .................... | H05K 5/0217 |
| | | | | 361/807 |
| 2019/0208650 A1* | 7/2019 | Kim | .................... | G06F 1/1652 |
| 2020/0103476 A1* | 4/2020 | Shin | .................... | G09F 9/301 |
| 2020/0107458 A1* | 4/2020 | Park | .................... | H05K 1/0203 |
| 2020/0170114 A1* | 5/2020 | Choi | .................... | H05K 5/0017 |
| 2021/0161023 A1* | 5/2021 | Pyo | .................... | G02F 1/133305 |
| 2021/0212211 A1* | 7/2021 | Tang | .................... | H05K 1/147 |
| 2022/0041403 A1* | 2/2022 | McCullagh | .................... | E04H 4/10 |
| 2022/0404872 A1* | 12/2022 | Cha | .................... | G06F 1/1656 |
| 2023/0209741 A1* | 6/2023 | Choi | .................... | B32B 3/08 |
| | | | | 361/807 |

FOREIGN PATENT DOCUMENTS

| | | |
|---|---|---|
| KR | 101758835 B1 | 7/2017 |
| KR | 1020170081347 A | 7/2017 |
| KR | 101773443 B1 | 9/2017 |
| KR | 1020200036409 A | 4/2020 |

\* cited by examiner

DISPLAY APPARATUS AND METHOD FOR MANUFACTURING SAME

This application claims priority to Korean Patent Application No. 10-2021-0187496, filed on Dec. 24, 2021, and all the benefits accruing therefrom under 35 U.S.C. § 119, the content of which in its entirety is herein incorporated by reference.

BACKGROUND

1. Field

Embodiments of the invention herein relate to a display apparatus and a method for manufacturing same.

2. Description of the Related Art

Electronic apparatuses such as smart phones, digital cameras, laptop computers, navigation units, and smart televisions, which provide an image to a user, include a display apparatus for displaying the image. The display apparatus generates an image and provides the generated image to the user through a display screen.

Recently, with the technological development for the display apparatus, various types of display apparatuses are being developed. A variety of flexible display apparatuses, which are deformable, foldable, or rollable into curved shapes, for example, are being developed. The flexible display apparatuses are easy to carry and may enhance user's convenience.

Flexible display modules used in the flexible display apparatuses may have deformable shapes. Such a display module is connected to a roller, and may be wound on the roller or unwound from the roller, for example. A structure that winds and unwinds the display module is desired.

SUMMARY

Embodiments of the invention provide a display apparatus capable of preventing a display module from being damaged and a method for manufacturing same.

An embodiment of the invention provides a display apparatus including a roller extending in a first direction, and a display module coupled to the roller. The roller includes a cylinder body having an inner accommodation space, and the cylinder body defines a slot that exposes the inner accommodation space to an outside and extends in the first direction. An outer surface of the cylinder body includes a support surface spaced a first distance from an axis of the cylinder body, and a guide surface extended to or from the support surface and recessed a predetermined distance toward the axis such that a distance to the axis is less than the first distance. The guide surface is extended to or from an end of the slot.

In an embodiment of the invention, a display apparatus includes a roller extending in a first direction, and a display module connected to the roller. The roller includes a cylinder body having an inner accommodation space, the cylinder body defines a slot that exposes the inner accommodation space to an outside and extends in the first direction, and an outer surface of the cylinder body extends from a first end of the slot in a circumferential direction and is extended to or from a second end of the slot. The outer surface of the cylinder body is provided continuously from the first end of the slot to the second end of the slot, and a portion of the display module is inserted into the slot.

In an embodiment of the invention, a method for manufacturing a display apparatus includes preparing a display module roller, and coupling a display module to the display module roller. The coupling of the display module to the display module roller includes coupling the display module to an insertion block of the display module roller, and inserting the insertion block, to which the display module is coupled, into a roller of the display module roller. The inserting of the insertion block into the roller includes moving the insertion block in a first direction via a side exposure hole, which is provided in a side surface of the roller and exposes an inner accommodation space of a cylinder body, and inserting the insertion block into the inner accommodation space.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain principles of the invention. In the drawings.

DETAILED DESCRIPTION

Figure 1:
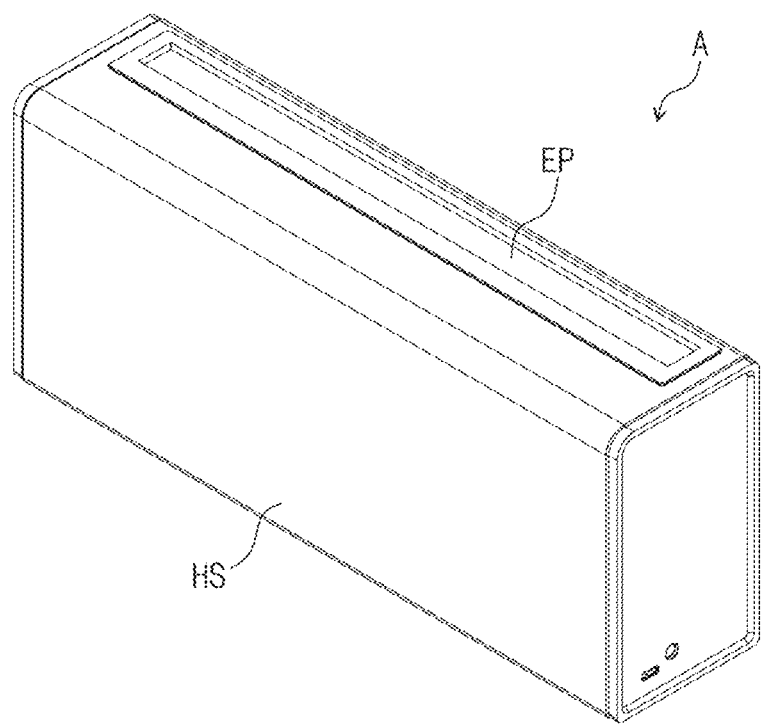
FIGS. 1 and 2 are perspective views showing an embodiment of a display apparatus according to the invention.
Figure 1:
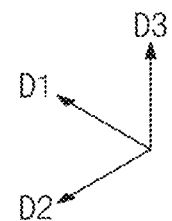

In this specification, when an element (or a region, a layer, a portion, or the like) is referred to as "being on", "being connected to", or "being coupled to" another element, it may be directly disposed/connected/coupled to another element, or an intervening third element may also be disposed therebetween.

Like numbers refer to like elements throughout. Also, in the drawings, the thicknesses, ratios, and dimensions of the elements are exaggerated for effective description of the technical contents. "And/or" includes one or more combinations which may be defined by the associated elements.

Although the terms first, second, etc. may be used to describe various elements, these elements should not be limited by these terms. These terms are only used to distinguish one element from another element. For example, a first element may be referred to as a second element, and similarly, a second element may also be referred to as a first element without departing from the scope of the invention. The singular forms include the plural forms as well, unless the context clearly indicates otherwise.

Also, terms of "below", "on lower side", "above", "on upper side", or the like may be used to describe the relationships of the elements illustrated in the drawings. These terms have relative concepts and are described on the basis of the directions indicated in the drawings.

It will be understood that the term "includes" or "comprises", when used in this specification, specifies the presence of stated features, integers, steps, operations, elements, components, or a combination thereof, but does not preclude the presence or addition of one or more other features, integers, steps, operations, elements, components, or combinations thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which the invention belongs. Also, terms, such as those defined in commonly used dictionaries, should be interpreted as having a meaning that is consistent with their meaning in the context of the relevant art and should not be interpreted in an idealized or overly formal sense unless expressly so defined herein.

Hereinafter, a display apparatus and a light-emitting element in an embodiment of the invention will be described with reference to the drawings.

Figure 2:
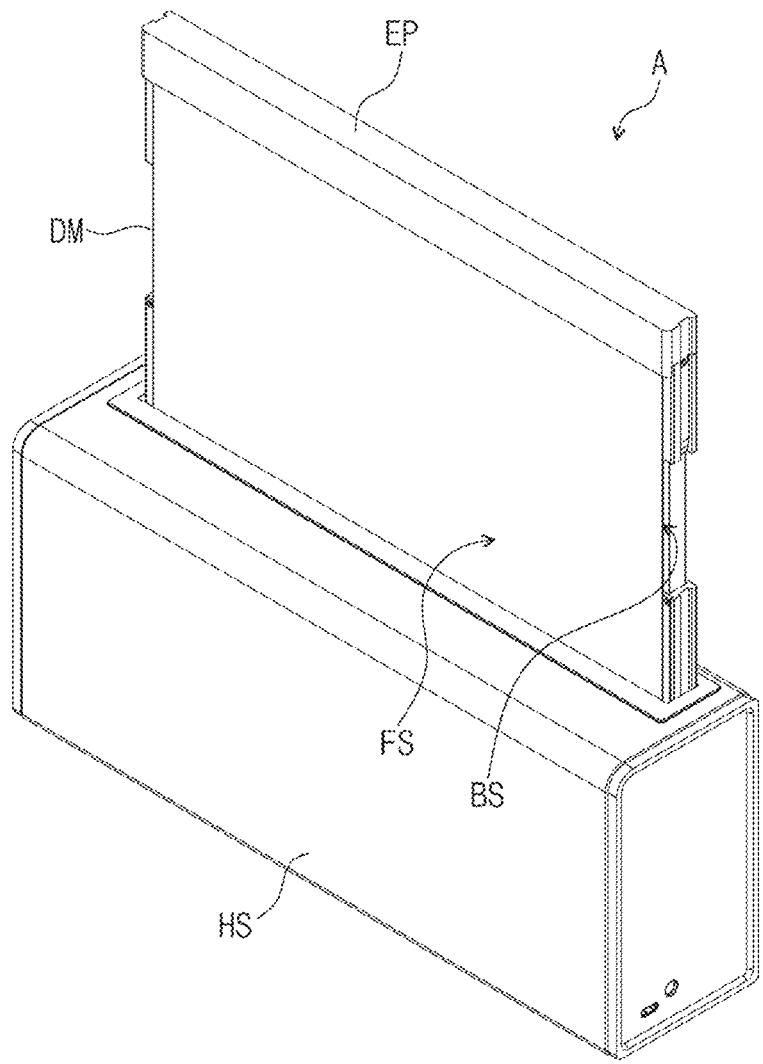
Figure 2:
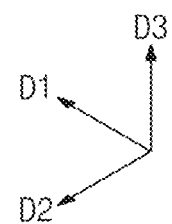
Figure 3:
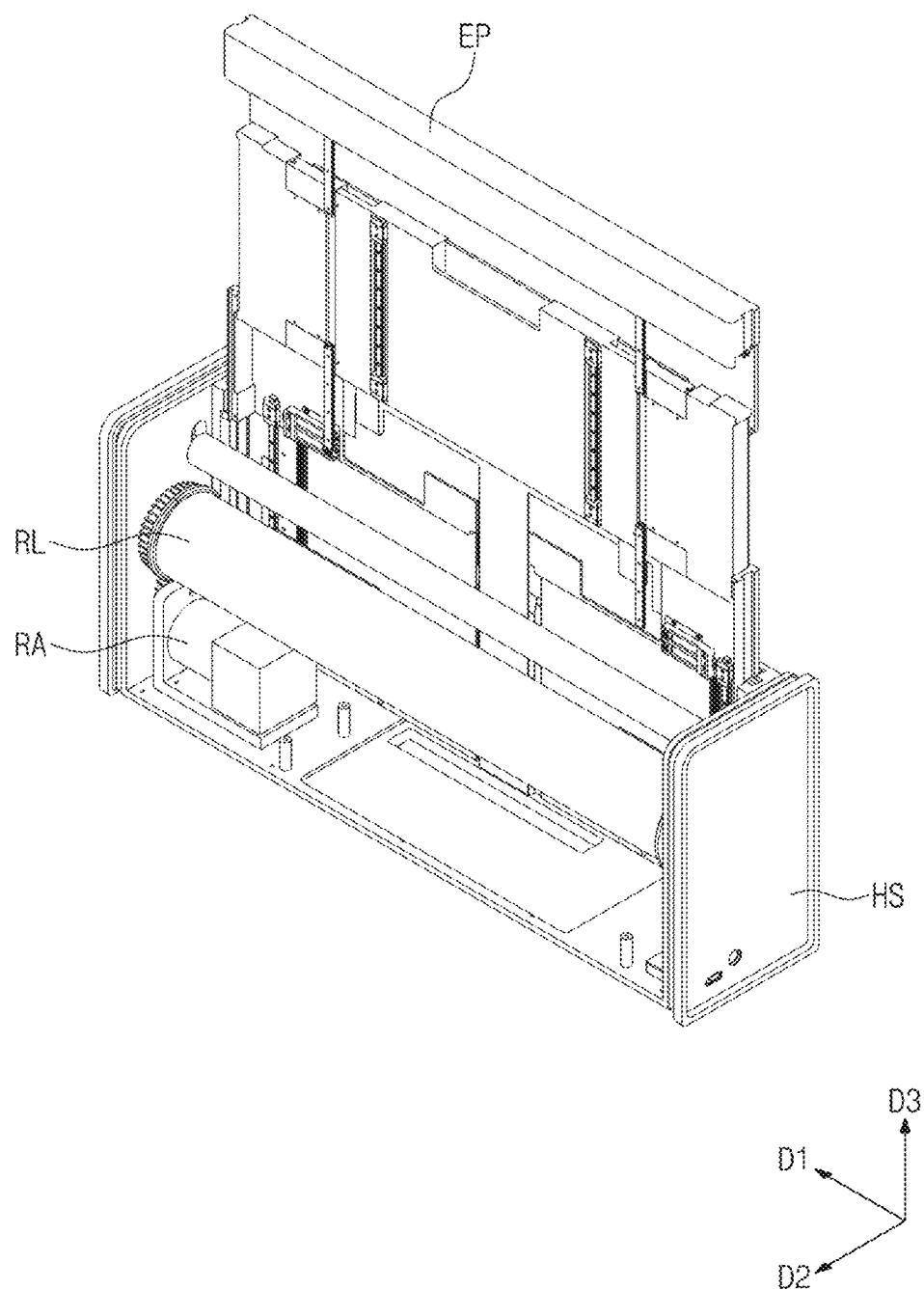
FIG. 3 is an exploded perspective view showing an embodiment of the display apparatus according to the invention.

FIGS. 1 and 2 are perspective views showing an embodiment of a display apparatus according to the invention, and FIG. 3 is an exploded perspective view showing an embodiment of the display apparatus according to the invention.

Hereinafter, in FIGS. 1 to 19, a direction D1 may be referred to as a first direction, a direction D2 crossing the first direction D1 may be referred to as a second direction, and a direction D3 crossing both the first direction D1 and the second direction D2 may be referred to as a third direction. Each of the first direction D1 and the second direction D2 may be also referred to as a horizontal direction.

Referring to FIGS. 1 to 3, a display apparatus A may be provided. The display apparatus A may include a housing HS, a raising/lowering driving device EP, a display module DM, a display module roller RL, and a roller driving device RA.

The housing HS may define an opening (not designated by a reference numeral) that is open in the third direction D3. The housing HS may extend longer in the first direction D1 than in the second direction D2.

The raising/lowering driving device EP may ascend or descend. A portion of the raising/lowering driving device EP may be disposed in the opening. The raising/lowering driving device EP may support the display module DM. More specifically, the raising/lowering driving device EP may support and fix an upper end of the display module DM. Due to the ascent and descent of the raising/lowering driving device EP, the display module DM may also ascend and descend. The raising/lowering driving device EP may include various mechanisms for raising and lowering the display module DM. In an embodiment, the raising/lowering driving device EP may include a plurality of motors, a plurality of guide rails, or the like, for example. However, the invention is not limited thereto, and the raising/lowering driving device EP may ascend and descend together with the display module DM by other means.

The display module DM may be accommodated in the housing HS. At least a portion of the display module DM may pass through the opening and be raised upward from the housing HS by the raising/lowering driving device EP. A front surface FS of the display module DM may be exposed to the outside. A rear surface BS of the display module DM may be oriented toward the raising/lowering driving device EP. In an embodiment, at least a portion of the rear surface BS of the display module DM may contact the raising/lowering driving device EP. The display module DM may have a quadrangular (e.g., rectangular) shape that has short sides extending in the third direction D3 and long sides extending in the first direction D1. However, the invention is not limited thereto, and the display module DM may have various shapes such as a circle or a polygon. This will be described later in detail.

The display module roller RL may be disposed inside the housing HS. In an embodiment, the display module roller RL may be connected to the housing HS so as to be rotatable about the first direction D1 inside the housing HS, for example. The display module roller RL may wind and unwind the display module DM. The display module roller RL may be rotated by the roller driving device RA. The display module roller RL will be described later in more detail.

The roller driving device RA may be connected to the display module roller RL. The roller driving device RA may provide rotation power to the display module roller RL. By the rotation power provided from the roller driving device RA, the display module roller RL may be rotated about an axis parallel to the first direction D1. To this end, the display module roller RL may include structures such as a motor and a gear.

Figure 4:
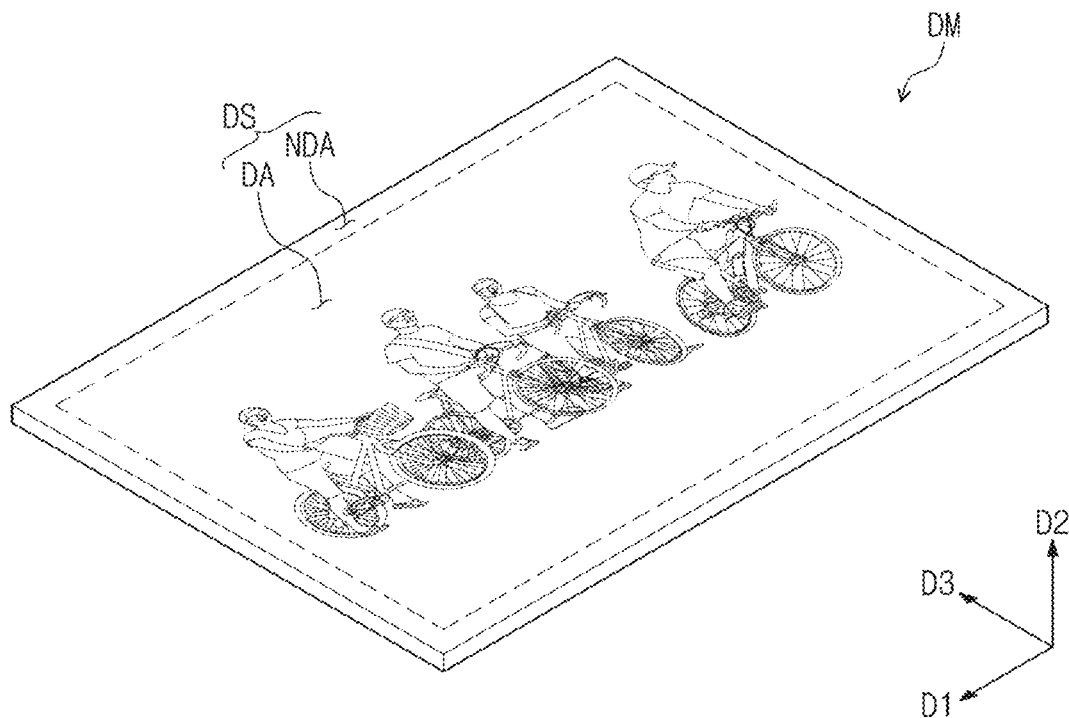
FIG. 4 is a view illustrating the display module accommodated in the housing illustrated in FIG. 1.

FIG. 4 is a view illustrating the display module accommodated in the housing illustrated in FIG. 1.

Referring to FIG. 4, a top surface of the display module DM may be defined as a display surface DS. The display surface DS may include a plane defined by the first direction D1 and the third direction D3. Through the display surface DS, an image generated in the display module DM may be provided to a user.

The display surface DS may include a display region DA and a non-display region NDA around the display region DA. The display region DA may display an image, and the non-display region NDA may not display an image. The non-display region NDA may define an edge of the display module DM, which surrounds the display region DA and is printed with a predetermined color.

Although not illustrated, function buttons may be arranged in the housing. The function buttons may provide various functions to the display apparatus A (refer to FIG. 2). In an embodiment, through the operations of function buttons, the display module DM may move to the outside of the housing HS or move to the inside of the housing HS, for example. Also, through the operations of function buttons, the luminance, sharpness, or the like of an image displayed on the display module DM may be controlled.

Figure 5:
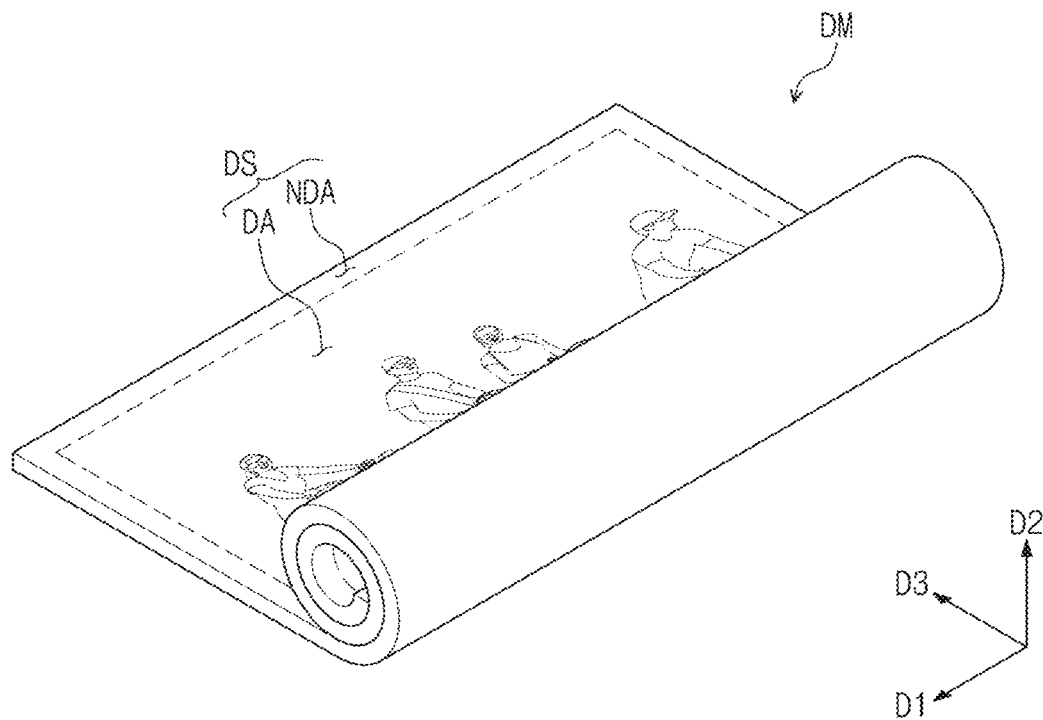
FIG. 5 is a view illustrating a rolling state of the display module illustrated in FIG. 4.

FIG. 5 is a view illustrating a rolling state of the display module illustrated in FIG. 4.

Referring to FIG. 5, the display module DM may be a flexible display module. The display module DM may be rolled like a scroll. The display module DM may be rolled in the third direction D3. The display module DM may be rolled from one side of the display module DM. The display module DM may be rolled such that the display surface DS faces the inside.

Figure 6:
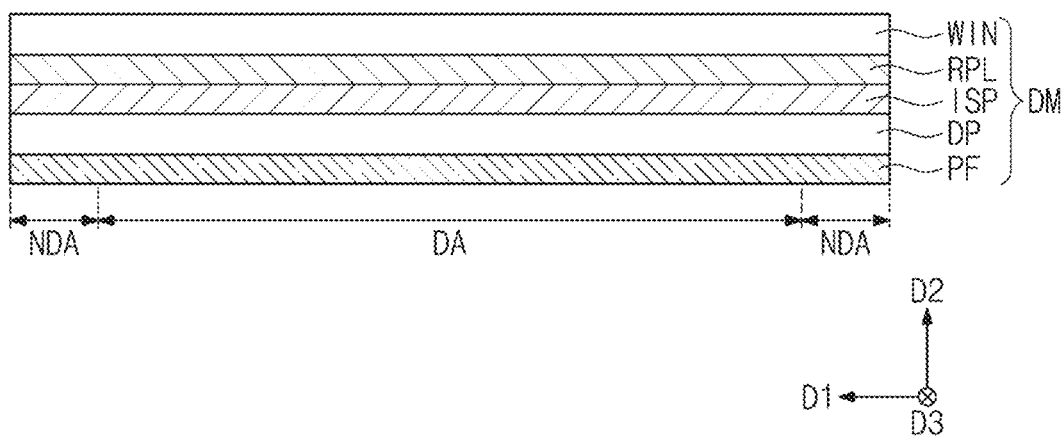
FIG. 6 is a view illustrating a cross-section of the display module illustrated in FIG. 4.

FIG. 6 is a view illustrating a cross-section of the display module illustrated in FIG. 4.

Referring to FIG. 6, the display module DM may include a display panel DP, an input sensing part ISP, a reflection preventing layer RPL, a window WIN, and a panel protection film PF.

The display panel DP may be a flexible display panel. The display panel DP in an embodiment of the invention may be a light emission-type display panel, but is not particularly limited. In an embodiment, the display panel DP may be an organic light-emitting display panel or an inorganic light-emitting display panel. A light-emitting layer of the organic light-emitting display panel may include an organic light-emitting material. A light-emitting layer of the inorganic light-emitting display panel may include quantum dots, quantum rods, or the like. Hereinafter, the display panel DP is described as the organic light-emitting display panel.

The input sensing part ISP may be disposed on the display panel DP. The input sensing part ISP may include a plurality of sensor parts (not shown) for sensing an external input in a capacitive method. The input sensing part ISP may be manufactured directly on the display panel DP when the display module DM is manufactured. However, the invention is not limited thereto, and the input sensing part ISP may be manufactured in the form of a panel independently from the display panel DP and attached to the display panel DP by an adhesive layer.

The reflection preventing layer RPL may be disposed on the input sensing part ISP. The reflection preventing layer RPL may be formed or disposed directly on the input sensing part ISP or coupled to the input sensing part ISP by an adhesive layer. The reflection preventing layer RPL may be defined as a film that prevents reflection of external light. The reflection preventing layer RPL may reduce the reflectance of external light which is incident toward the display panel DP from above the display apparatus A.

In a case where the external light that has traveled toward the display panel DP is reflected from the display panel DP and then redirected to an external user, the user may recognize the external light as in a mirror. To prevent the above-described phenomenon, the reflection preventing layer RPL may include, a plurality of color filters that display the same color as pixels of the display panel DP, for example.

The color filters may filter the external light to display the same color as the pixels. In this case, the external light may not be recognized by the user. However, the invention is not limited thereto, and the reflection preventing layer RPL may include a polarization film for reducing the reflectance of the external light. The polarization film may include a phase retarder and/or a polarizer.

The window WIN may be disposed on the reflection preventing layer RPL. The window WIN may be formed or disposed directly on the reflection preventing layer RPL or coupled to the reflection preventing layer RPL by an adhesive layer. The window WIN may protect the display panel DP, the input sensing part ISP, and the reflection preventing layer RPL against scratch and impact from the outside.

The panel protection film PF may be disposed below the display panel DP. The panel protection film PF may be formed or disposed directly below the display panel DP or coupled to the display panel DP by an adhesive layer. The panel protection film PF may protect a lower portion of the display panel DP. In an embodiment, the panel protection film PF may include a flexible plastic material such as polyethyleneterephthalate ("PET").

Figure 7:
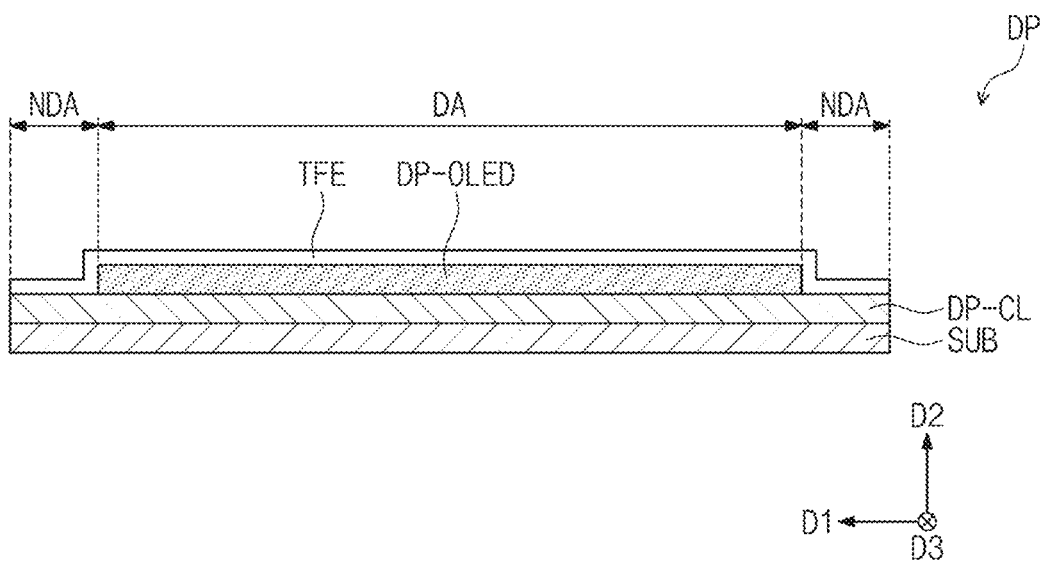
FIG. 7 is a view illustrating a cross-section of the display module illustrated in FIG. 6.

FIG. 7 is a view illustrating a cross-section of the display module illustrated in FIG. 6.

Referring to FIG. 7, the display panel DP may include a substrate SUB, a circuit element layer DP-CL disposed on the substrate SUB, a display element layer DP-OLED disposed on the circuit element layer DP-CL, and a thin film encapsulation layer TFE disposed on the display element layer DP-OLED.

The substrate SUB may include a display region DA and a non-display region NDA around the display region DA. The substrate SUB may include a flexible plastic material such as polyimide ("PI"). The display element layer DP-OLED may be disposed on the display region DA.

A plurality of pixels may be arranged in the display region DA. Each of the pixels may include a light-emitting element that is disposed in the display element layer DP-OLED and connected to a transistor disposed in the circuit element layer DP-CL.

The thin film encapsulation layer TFE may be disposed on the circuit element layer DP-CL to cover the display element layer DP-OLED. The thin film encapsulation layer TFE may include inorganic layers and an organic layer between the inorganic layers. The inorganic layers may protect pixels from moisture/oxygen. The organic layer may protect the pixels from foreign substances such as dust particles.

Figure 8:
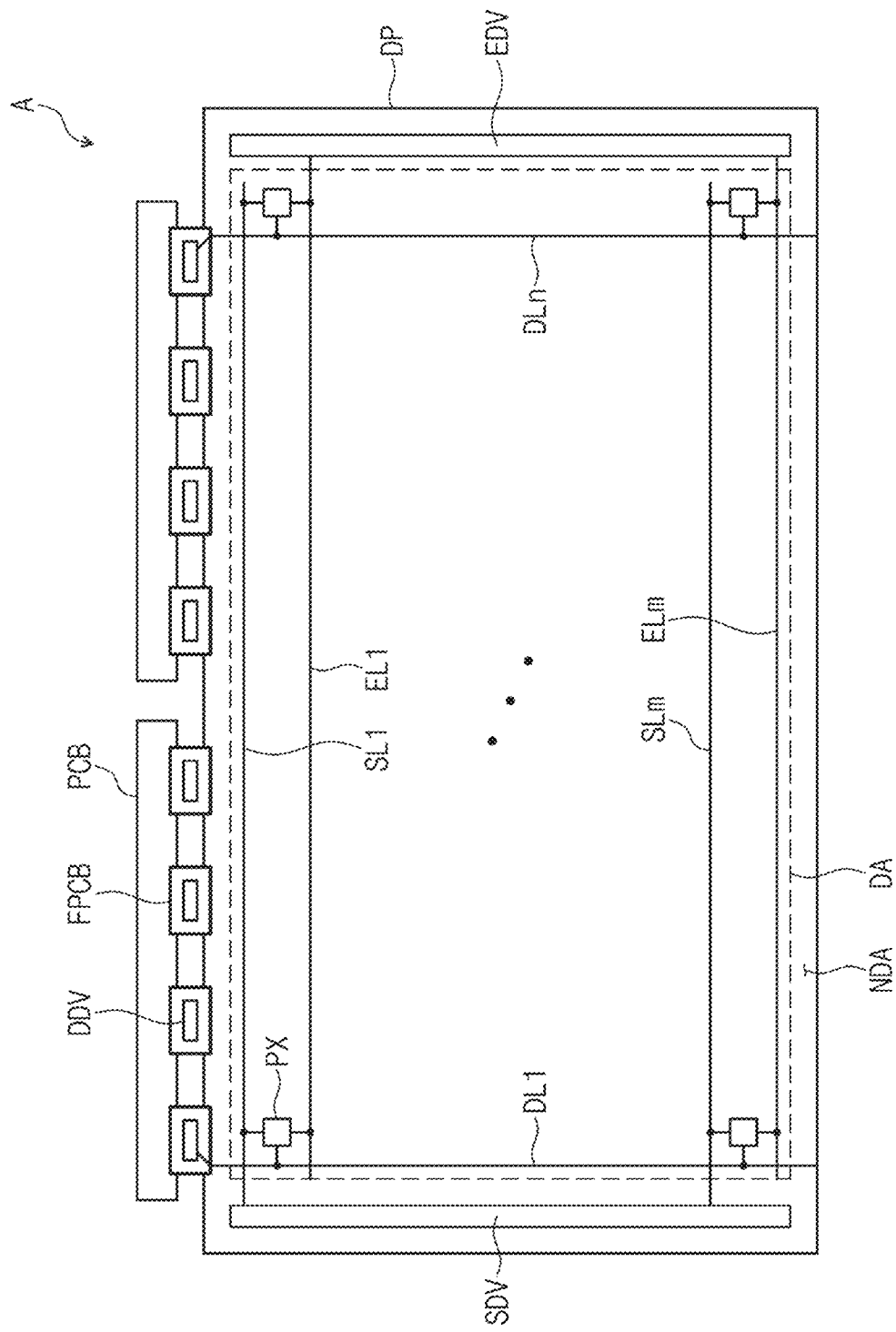
FIG. 8 is a plan view of the display module illustrated in FIG. 6.

FIG. 8 is a plan view of the display module illustrated in FIG. 6.

Referring to FIG. 8, the display apparatus A may include a display panel DP, a scan driver SDV, a plurality of data drivers DDV, a plurality of flexible circuit boards FPCB, a plurality of printed circuit boards PCB, and an emission driver EDV.

The display panel DP may include a display region DA and a non-display region NDA surrounding the display region DA. The display panel DP may have a quadrangular (e.g., rectangular) shape, but the shape of the display panel DP is not limited thereto.

The display panel DP may include a plurality of pixels PX, a plurality of scan lines SL1 to SLm, a plurality of data lines DL1 to DLn, and a plurality of light emission lines EL1 to ELm. Here, m and n are natural numbers.

The pixels PX may be arranged in the display region DA. The scan driver SDV and the emission driver EDV may be arranged in the non-display region NDA and adjacent to the respective short sides of the display panel DP.

The data drivers DDV may be arranged adjacent to the upper side of the display panel DP defined as one of the long sides of the display panel DP. The printed circuit boards PCB may be arranged adjacent to the upper side of the display panel DP. The flexible circuit boards FPCB may be connected to both the upper side of the display panel DP and the printed circuit boards PCB. The data drivers DDV may be manufactured in the form of an integrated circuit chip and disposed (e.g., mounted) on the respective flexible circuit boards FPCB.

The scan lines SL1 to SLm may be connected to the pixels PX and the scan driver SDV. The light emission lines EL1 to ELm may be connected to the pixels PX and the emission driver EDV.

The data lines DL1 to DLn may be connected to the pixels PX and the data drivers DDV. The two data lines DL1 and DLn connected to the data drivers DDV arranged respectively on the leftmost side and the rightmost side are illustrated, but substantially, the plurality of data lines may be connected to the respective data drivers DDV.

Although not illustrated, the display apparatus A may further include a timing controller (not shown) for controlling the operations of the scan driver SDV, the data drivers DDV, and the emission driver EDV. The controller may be manufactured in the form of an integrated circuit chip and disposed (e.g., mounted) on the printed circuit boards PCB. The timing controller may be connected to the data drivers DDV, the scan driver SDV, and the emission driver EDV via the printed circuit boards PCB and the flexible circuit boards FPCB.

The scan driver SDV generates a plurality of scan signals, and the scan signals may be applied to the pixels PX through the scan lines SL1 to SLm. The data drivers DDV generate a plurality of data voltages, and the data voltages may be applied to the pixels PX through the data lines DL1 to DLn. The emission driver EDV generates a plurality of light emission signals, and the light emission signals may be applied to the pixels PX through the light emission lines EL1 to Elm.

The pixels PX may receive the data voltages in response to the scan signals. The pixels PX may emit light, which has luminance corresponding to the data voltages, in response to the light emission signals, thereby displaying an image. Light emission times of the pixels PX may be controlled by the light emission signals.

Figure 9:
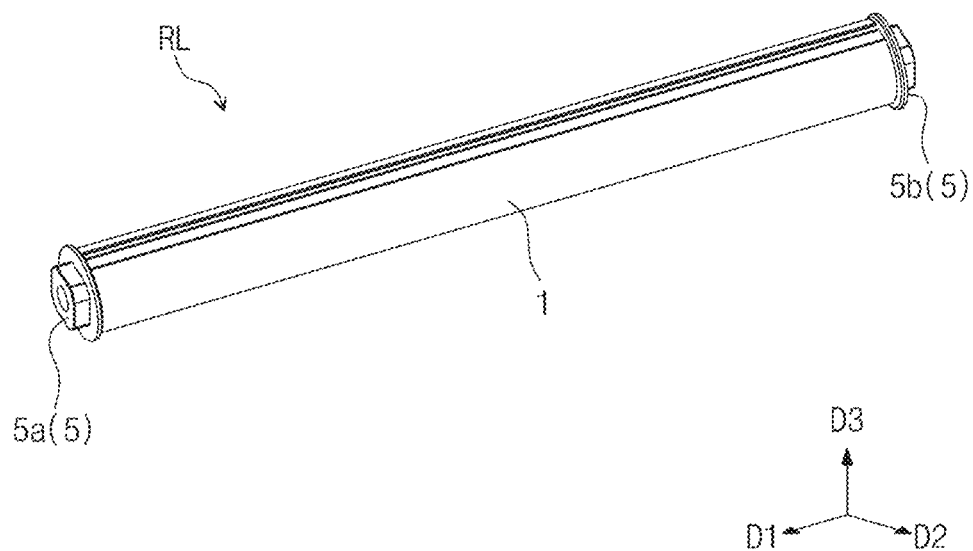
FIG. 9 is a perspective view showing an embodiment of a display module roller according to the invention.
Figure 10:
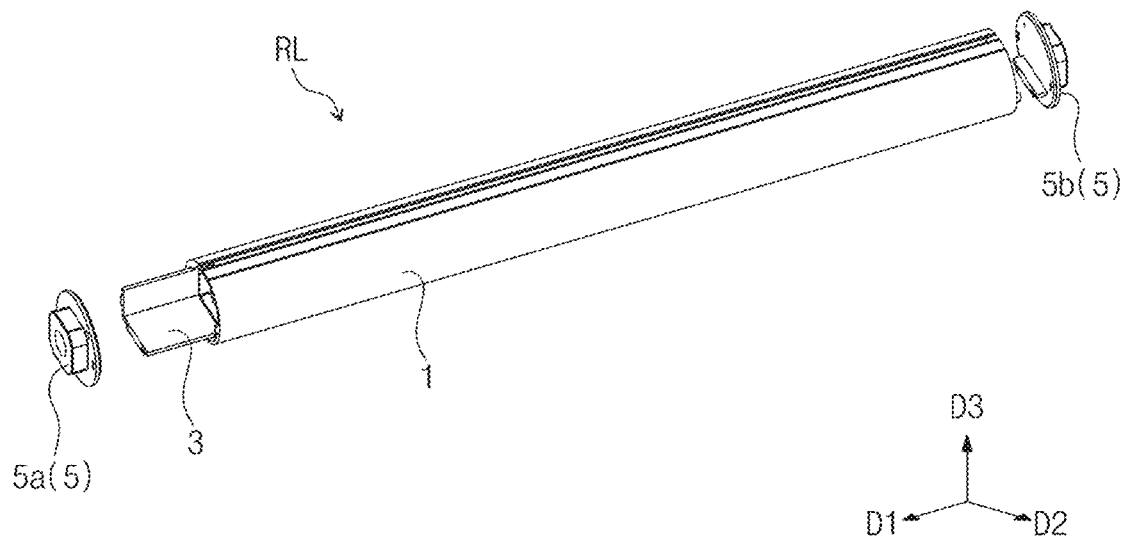
FIG. 10 is an exploded perspective view showing an embodiment of the display module roller according to the invention.

FIG. 9 is a perspective view showing an embodiment of a display module roller according to the invention, and FIG. 10 is an exploded perspective view showing an embodiment of the display module roller according to the invention.

Referring to FIGS. 9 and 10, a display module roller RL may include a roller 1, an insertion block 3, and a cap 5.

The roller 1 may extend in a first direction D1. The roller 1 may have a generally cylindrical shape. A space may be provided inside the roller 1. The space provided inside the roller 1 may be also referred to as an inner accommodation space 11h (refer to FIG. 11). The roller 1 may wind and unwind a display module DM. The roller 1 will be described later in more detail.

The insertion block 3 may extend in the first direction D1. The display module DM (refer to FIG. 2) may be connected to the insertion block 3. The insertion block 3 may be coupled to the roller 1. More specifically, the insertion block 3 may be inserted into the roller 1. That is, the insertion block 3 may be inserted into the inner accommodation space 11h. A portion of the display module DM may be inserted into the roller 1 by the insertion block 3. Also, the insertion block 3 may fix one end of the display module DM to the inside of the roller 1. The insertion block 3 will be described later in more detail.

The cap 5 may be coupled to the roller 1. In an embodiment, the cap 5 may be coupled to a side surface of the roller 1, for example. The cap 5 may seal the inner accommodation space 11h (refer to FIG. 11). Two caps 5 may be provided. These two caps 5 may be also referred to as a first cap 5a and a second cap 5b, respectively. The first cap 5a and the second cap 5b may be coupled to the two side surfaces of the roller 1, respectively. The first cap 5a and the second cap 5b coupled to the roller 1 may be spaced apart from each other in the first direction D1. The cap 5 will be described later in more detail.

Figure 11:
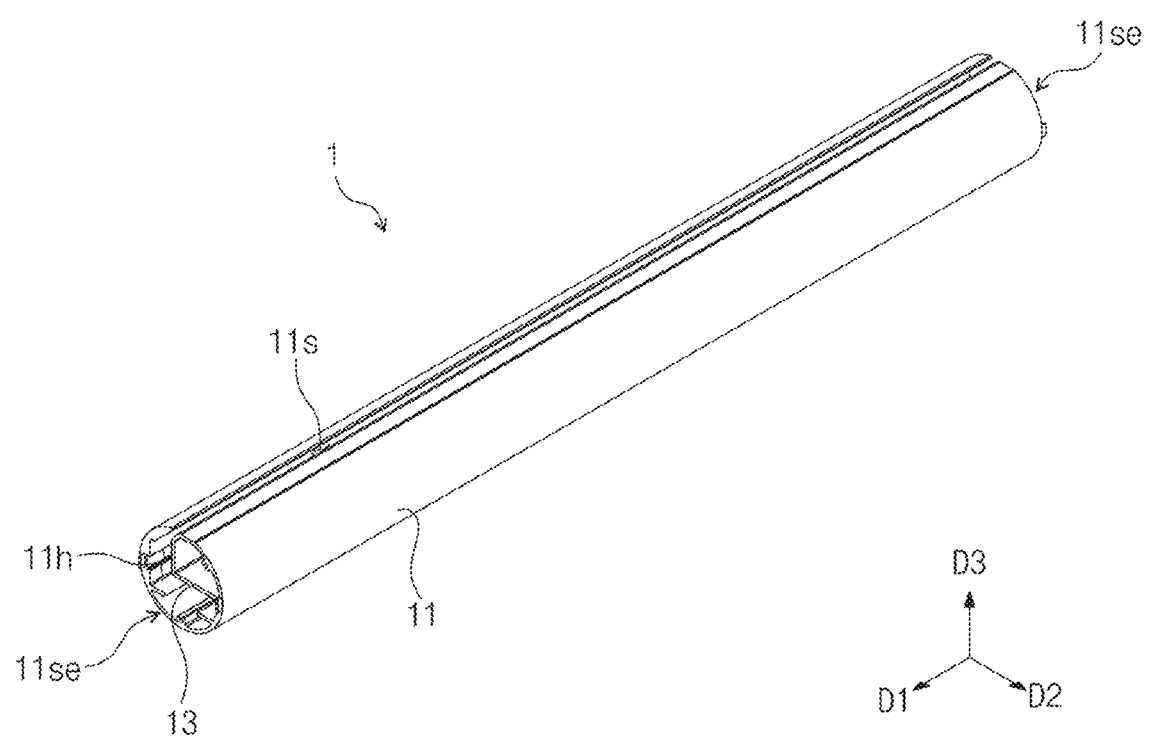
FIG. 11 is a perspective view showing an embodiment of a roller according to the invention.
Figure 12:
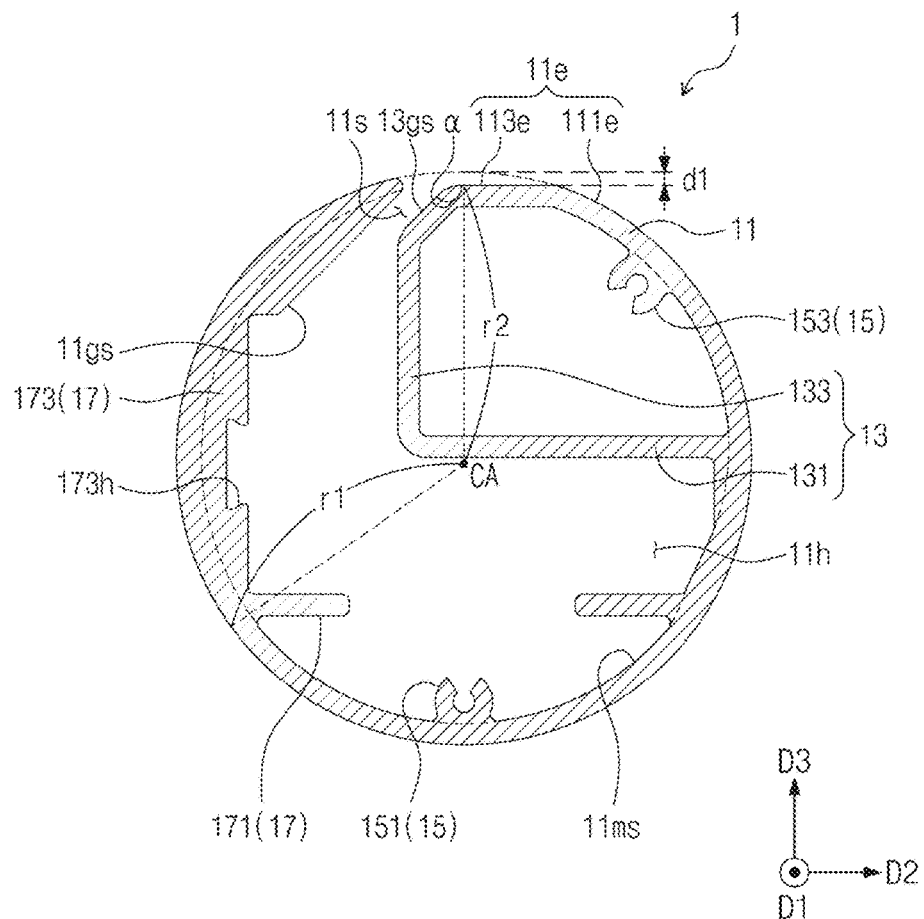
FIG. 12 is a cross-sectional view showing an embodiment of the roller according to the invention.

FIG. 11 is a perspective view showing an embodiment of a roller in an embodiment of the invention, and FIG. 12 is a cross-sectional view showing an embodiment of the roller according to the invention.

Referring to FIG. 11 on the basis of FIG. 12, the roller 1 may include a cylinder body 11, an inner support plate 13, an inner screw fastening block 15, and an inner coupling block 17.

The cylinder body 11 may have a cylindrical shape. The cylinder body 11 may have an axis CA extending in the first direction D1. The cylinder body 11 may define the inner accommodation space 11h. That is, the inner accommodation space 11h may be defined by an inner surface 11ms of the cylinder body 11. The inner support plate 13, the inner screw fastening block 15, the inner coupling block 17, or the like may be disposed in the inner accommodation space 11h. Also, the insertion block 3 (refer to FIG. 10) may be inserted into the inner accommodation space 11h. The side surface of the cylinder body 11 may be open. That is, a side exposure hole 11se may be defined in the side surface of the cylinder body 11. Two side exposure holes 11se may be provided. The two side exposure holes 11se may be spaced apart from each other in the first direction D1. However, the invention is not limited thereto, and only one side exposure hole 11se may be provided. That is, one side surface of the cylinder body 11 is opened, but the other side surface may be closed. The inner accommodation space 11h may extend in the first direction D1 and may be extended to or from the side exposure hole 11se of the cylinder body 11. That is, the inner accommodation space 11h may be exposed to the outside by the side exposure hole 11se.

The cylinder body 11 may define a slot 11s. The slot 11s passes through a portion of the cylinder body 11 and may connect the inner accommodation space 11h to an outer space. That is, the inner accommodation space 11h may be exposed to the outside via the slot 11s. The slot 11s may extend in the first direction D1. The slot 11s may be extended to or from the side exposure hole 11se. In an embodiment, the slot 11s may be extended to or from all of the two side exposure holes 11se, for example. In an alternative embodiment, the slot 11s may be extended to or from only one side exposure hole 11se. Only one slot 11s may be provided. That is, there may be no holes other than the slot 11s in the outer surface of the cylinder body 11. This will be described later in detail.

An outer surface 11e of the cylinder body 11 may extend from one end of the slot 11s to the other end of the slot 11s in the circumferential direction. The outer surface 11e may be formed or disposed continuously from the one end of the slot 11s to the other end of the slot 11s. When a surface is formed or disposed continuously, it may mean that the surface continues without interruption along the extension direction of the surface. That is, when a surface is formed or disposed continuously, it may mean that there is no discontinuity in the surface. In an embodiment, when the outer surface 11e is formed or disposed continuously from the one end of the slot 11s to the other end of the slot 11s, it may mean that there are no holes or discontinuities other than the slot 11s in the outer surface 11e, for example. The outer surface 11e may include a guide surface 113e and a support surface 111e.

The guide surface 113e may be extended to or from the one end of the slot 11s. When the guide surface 113e is extended to or from the one end of the slot 11s, it may mean that a portion of the guide surface 113e defines the one end of the slot 11s. The guide surface 113e may be recessed a predetermined distance toward the axis CA. More specifically, the guide surface 113e may be closer to the axis CA than the support surface 111e is. That is, a distance between the guide surface 113e and the axis CA may be shorter than a distance between the support surface 111e and the axis CA. In an embodiment, the guide surface 113e may have a flat surface shape. More specifically, the guide surface 113e may have a flat surface shape parallel to the first direction D1. A distance between the guide surface 113e and the axis CA may be also referred to as a second distance r2. The second distance r2 may represent the length of a vertical line perpendicular to the guide surface 113e from the axis CA. However, the invention is not limited thereto, and the guide surface 113e may be a curved surface instead of a flat surface. That is, in another embodiment, the guide surface 113e may be a curve in the cross-sectional view in FIG. 12.

The support surface 111e may be extended to or from the guide surface 113e. The support surface 111e extends from the guide surface 113e in the circumferential direction and may be extended to or from the other end of the slot 11s. When the support surface 111e is extended to or from the other end of the slot 11s, it may mean that a portion of the support surface 111e defines the other end of the slot 11s. A distance between the support surface 111e and the axis CA may be also referred to as a first distance r1. The first distance r1 may be constant. Thus, in the cross-sectional view taken perpendicular to the first direction D1 as in FIG. 12, the support surface 111e may be a portion of a circle centered on the axis CA. That is, the curvature of the support surface 111e may be constant. However, the invention is not limited thereto, and in another embodiment, the support surface 111e may be a portion of an ellipse of which the curvature varies in the cross-sectional view of FIG. 12.

The first distance r1 may be greater than the second distance r2. The first distance r1 may be greater than the second distance r2 by a first thickness d1. In an embodiment, the first distance r1 may be about 15 millimeters (mm) to about 25 mm, for example. More specifically, the first distance r1 may be about 20 mm. In an embodiment, the second distance r2 may be less than the first distance r1 by about 300 micrometers (μm) to about 700 μm. That is, the first thickness d1 may be about 300 μm to about 700 μm. More specifically, the second distance r2 may be less than the first distance r1 by about 500 μm. However, the invention is not limited thereto, and the first thickness d1 may be determined diversely according to the thickness of the display module DM.

The inner support plate 13 may be extended to or from the inner surface 11ms of the cylinder body 11. The inner support plate 13 may divide the inner accommodation space 11h. That is, the inner accommodation space 11h m ay be divided into two or more spaces by the inner support plate 13. The inner support plate 13 may extend in the first direction D1. The length of the inner support plate 13 in the first direction D1 may be substantially identical or similar to the length of the cylinder body 11 in the first direction D1. The inner support plate 13 may include a first plate 131 and a second plate 133. One side (e.g., right side in FIG. 12) of the first plate 131 may be extended to or from the inner surface 11ms of the cylinder body 11. The first plate 131 may extend in a second direction D2. One side (e.g., lower side in FIG. 12) of the second plate 133 may be extended to or from the other side (e.g., left side in FIG. 12) of the first plate 131. The second plate 133 may extend in a third direction D3. The other side (e.g., upper side in FIG. 12) of the second plate 133 may be extended to or from the guide surface 113e. The second plate 133 may include an inner guide surface 13gs. The inner guide surface 13gs may contact the slot 11s. That is, a portion of the slot 11s may be defined by the inner guide surface 13gs. The inner guide surface 13gs may be extended to or from the guide surface 113e. The inner guide surface 13gs may have a flat surface shape parallel to the first direction D1. An angle between the inner guide surface 13gs and the guide surface 113e may be greater than about 90 degrees. More specifically, among dihedral angles between the inner guide surface 13gs and the guide surface 113e, a first angle α, which is an angle directed toward the inner accommodation space 11h, may be about 90 degrees or more.

The inner surface 11ms of the cylinder body 11 may include a second inner guide surface 11gs. The second inner guide surface 11gs may face the inner guide surface 13gs. More specifically, the second inner guide surface 11gs may face the inner guide surface 13gs with the slot 11s therebetween. That is, a portion of the slot 11s may be defined by a portion of the second inner guide surface 11gs. The second inner guide surface 11gs may be substantially parallel to the inner guide surface 13gs, but the invention is not limited thereto.

The inner screw fastening block 15 may be extended to or from the inner surface 11ms of the cylinder body 11. The inner screw fastening block 15 may define a screw insertion groove. A screw (not shown) may be coupled to the screw insertion groove. This will be described later in detail. The inner screw fastening block 15 may extend in the first direction D1. The length of the inner screw fastening block 15 in the first direction D1 may be substantially identical or similar to the length of the cylinder body 11 in the first direction D1. A plurality of inner screw fastening blocks 15 may be provided. In an embodiment, the inner screw fastening blocks 15 may include a first screw block 151 and a second screw block 153, for example. The first screw block 151 and the second screw block 153 may be spaced apart from each other in the circumferential direction. However, hereinafter, the inner screw fastening block 15 will be described in singular form for convenience.

The inner coupling block 17 may be extended to or from the inner surface 11ms of the cylinder body 11. The inner coupling block 17 may extend in the first direction D1. The length of the inner coupling block 17 in the first direction D1 may be substantially identical or similar to the length of the cylinder body 11 in the first direction D1. The inner coupling block 17 may include a first coupling block 171 and a second coupling block 173. The first coupling block 171 may extend from the inner surface 11ms of the cylinder body 11 toward the inner accommodation space 11h. Two first coupling blocks 171 may be provided. These two first coupling blocks 171 may be spaced apart from and face each other in the second direction D2. The second coupling block 173 may provide a coupling groove 173h. The coupling groove 173h may extend in the first direction D1 of the second coupling block 173. The length of the coupling groove 173h in the first direction D1 may be substantially identical or similar to the length of the cylinder body 11 in the first direction D1.

Figure 13:
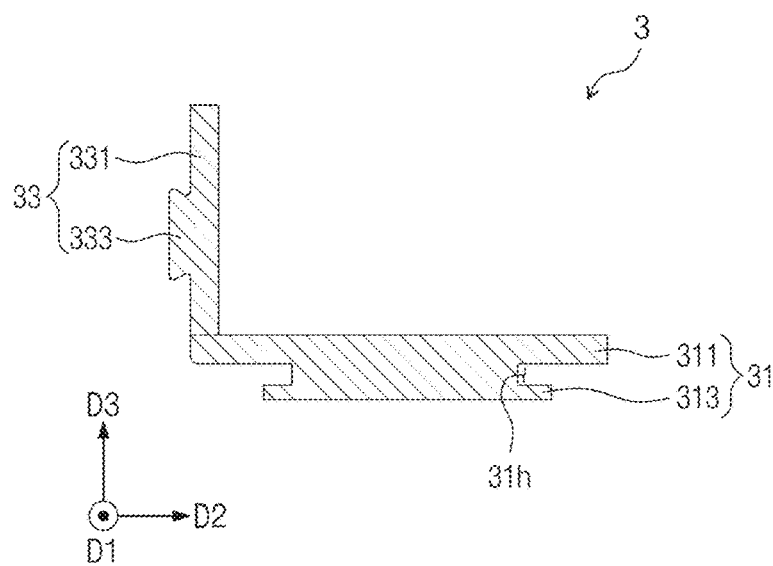
FIG. 13 is a cross-sectional view showing an embodiment of an insertion block according to the invention.

FIG. 13 is a cross-sectional view showing an embodiment of an insertion block according to the invention.

Referring to FIG. 11 on the basis of FIG. 13, the insertion block 3 may extend in the first direction D1. The insertion block 3 may include a first block 31 and a second block 33. The first block 31 may extend in the second direction D2. The first block 31 may include a first block body 311 and a first protrusion block 313. An insertion groove 13h may be defined between the first block body 311 and the first protrusion block 313. The second block 33 may include a second block body 331 and a second protrusion block 333. The second block body 331 may extend in the third direction D3. The second block body 331 may be extended to or from one side of the first block 31. The second protrusion block 333 may be extended to or from one surface of the second block body 331. More specifically, the second protrusion block 333 may be extended to or from the second block body 331 on the opposite side from the second direction D2 with respect to the second block body 331. The insertion block 3 has been illustrated and described as having a generally 'L' shape, but the invention is not limited thereto. That is, the insertion block 3 may be diversely changed with reference to the shape of the roller 1 (refer to FIG. 12), the shape of the display module DM (refer to FIG. 2), or the like. In an embodiment, a hole 31h may be defined in a side of the first block 31 in the second direction D2.

Figure 14:
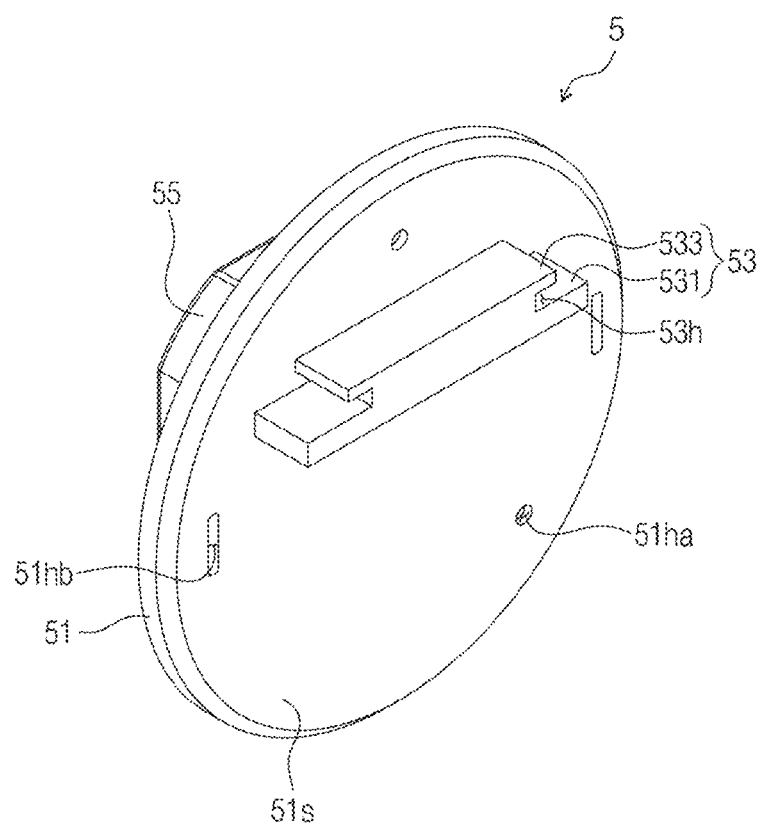
FIG. 14 is a perspective view showing an embodiment of a cap according to the invention.

FIG. 14 is a perspective view showing an embodiment of a cap according to the invention.

Referring to FIG. 14, the cap 5 may include a cap body 51, a fixing block 53, and a connection block 55. The cap body 51 may have a disc shape. The cap body 51 may define an extension screw insertion groove 51ha and a fixing insertion groove 51hb. The extension screw insertion groove 51ha may extend from an inner side surface 51s of the cap body 51 to an outer side surface. In a state in which the cap 5 is extended to or from the roller 1, the extension screw insertion groove 51ha may be extended to or from the screw insertion groove (refer to FIG. 12). A plurality of extension screw insertion grooves 51ha may be provided. In an embodiment, the extension screw insertion grooves 51ha may be provided as many as the number of screw insertion grooves, for example. The fixing insertion groove 51hb may extend in a vertical (upward and downward) direction. Two fixing insertion grooves 51hb may be provided. These two fixing insertion grooves 51hb may be spaced apart from each other in the horizontal direction. The fixing block 53 may be coupled onto the inner side surface 51s of the cap body 51. The fixing block 53 may include a first fixing block 531 and a second fixing block 533. The first fixing block 531 and the second fixing block 533 may be arrayed in a vertical (upward and downward) direction. The connection block 55 may be coupled to the outer side surface of the cap body 51. In an embodiment, a hole 53h may be defined in a side of the fixing block 53 in a horizontal direction.

Figure 15:
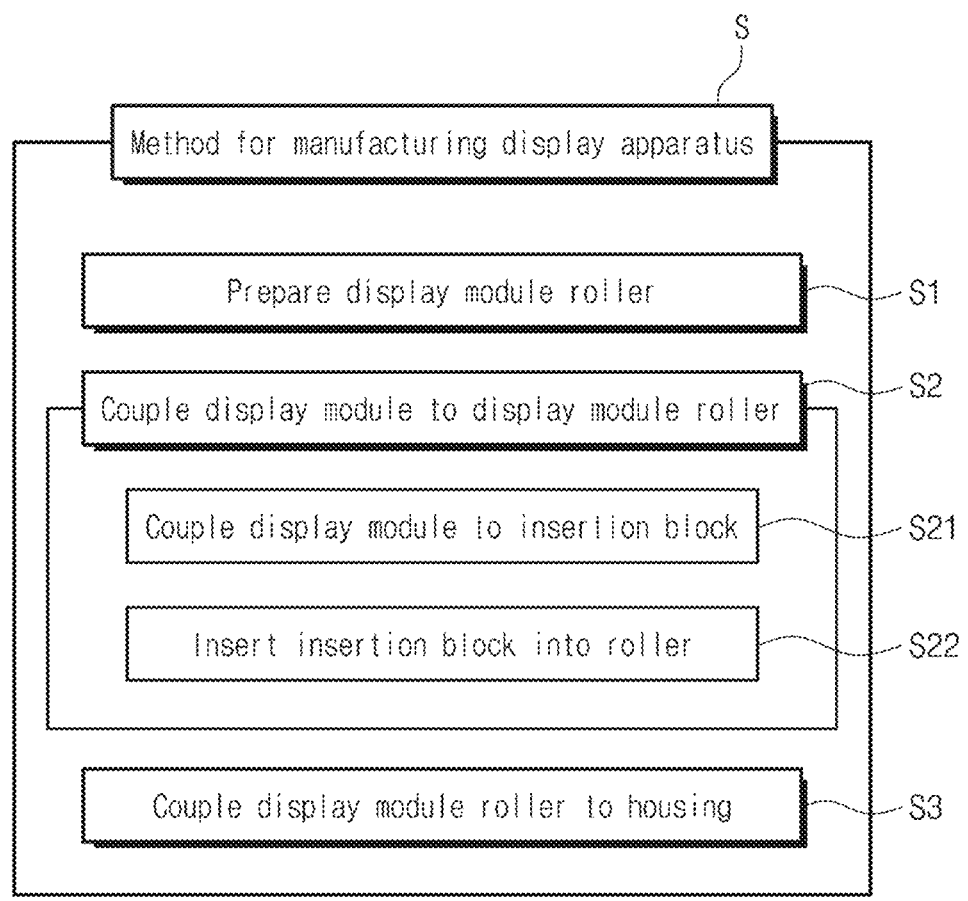
FIG. 15 is a flowchart showing an embodiment of a method for manufacturing a display apparatus according to the invention.

FIG. 15 is a flowchart showing an embodiment of a method for manufacturing a display apparatus according to the invention.

Referring to FIG. 15, a method (S) for manufacturing a display apparatus may be provided. The method (S) for manufacturing a display apparatus may be a method for manufacturing the display apparatus A (refer to FIG. 2) which has been described with reference to FIGS. 1 to 14. The method (S) for manufacturing a display apparatus may include preparing (S1) a display module roller, coupling (S2) a display module to the display module roller, and coupling (S3) the display module roller to a housing.

The coupling (S2) of the display module to the display module roller may include coupling (S21) the display module to an insertion block and inserting (S22) the insertion block into a roller.

Hereinafter, the method (S) for manufacturing a display apparatus of FIG. 15 will be described sequentially with reference to FIGS. 16 to 19.

Figure 16:
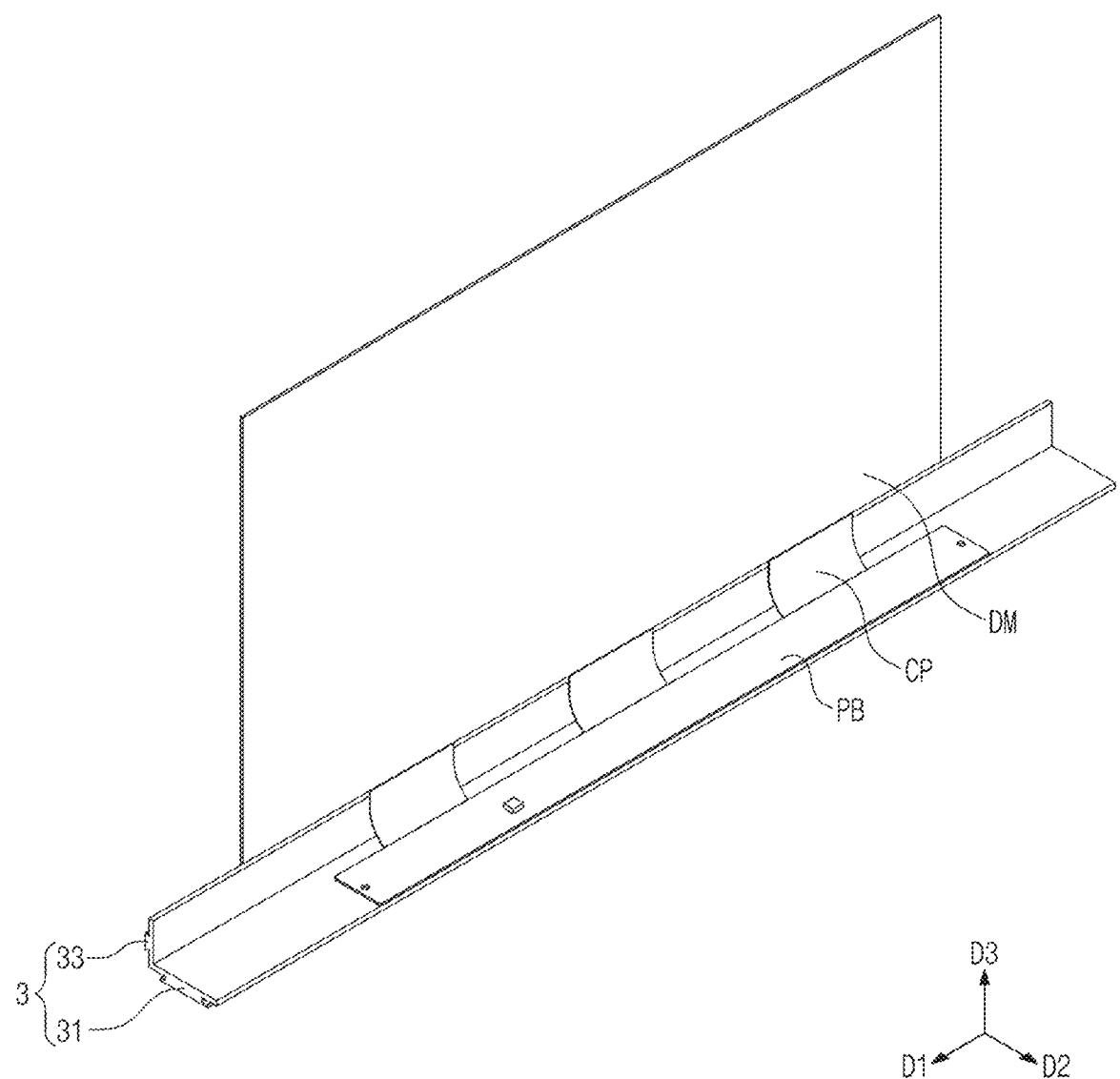
FIGS. 16 and 17 are perspective views sequentially showing the method for manufacturing a display apparatus according to the flowchart of FIG. 15.
Figure 17:
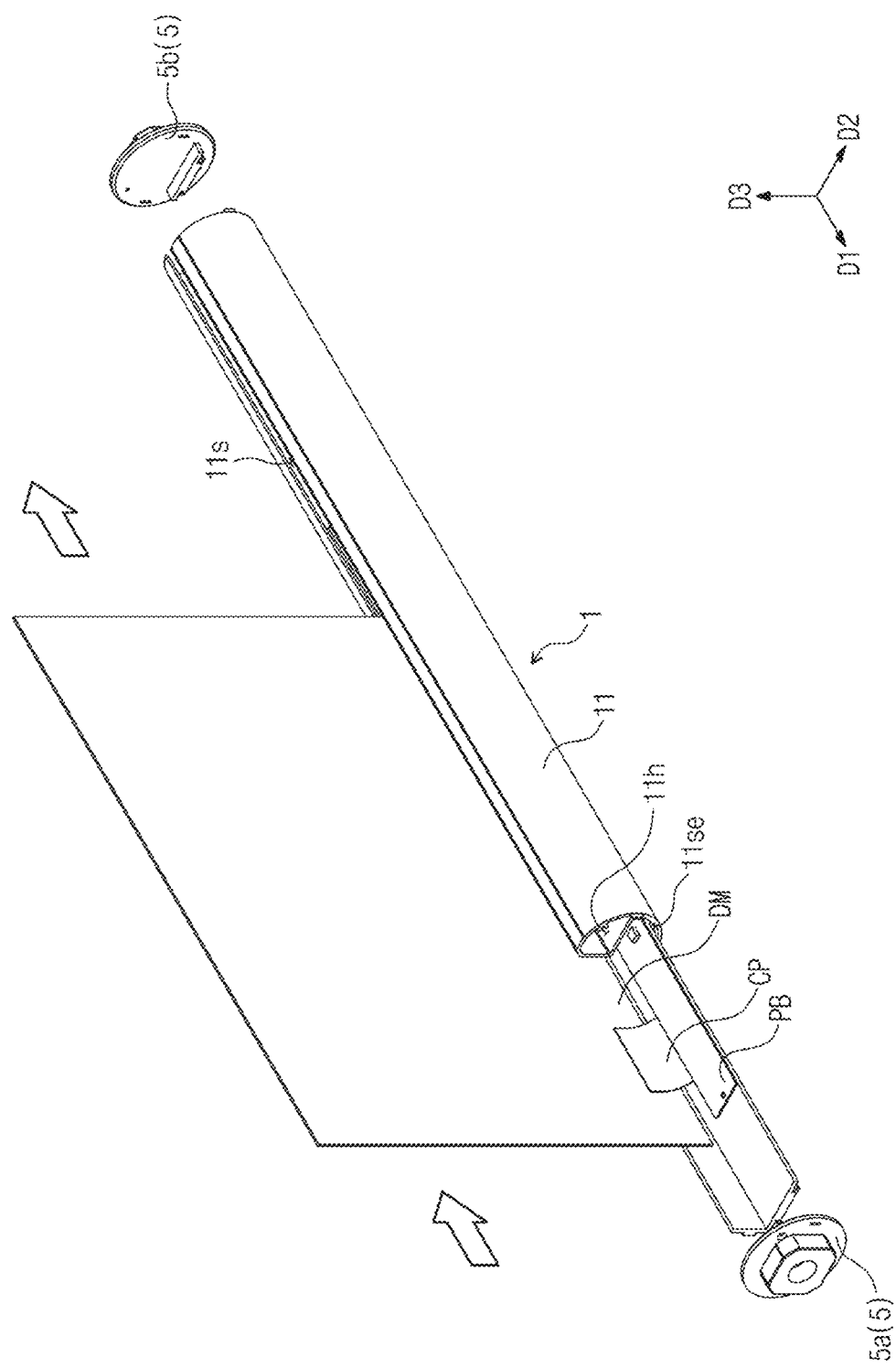
Figure 18:
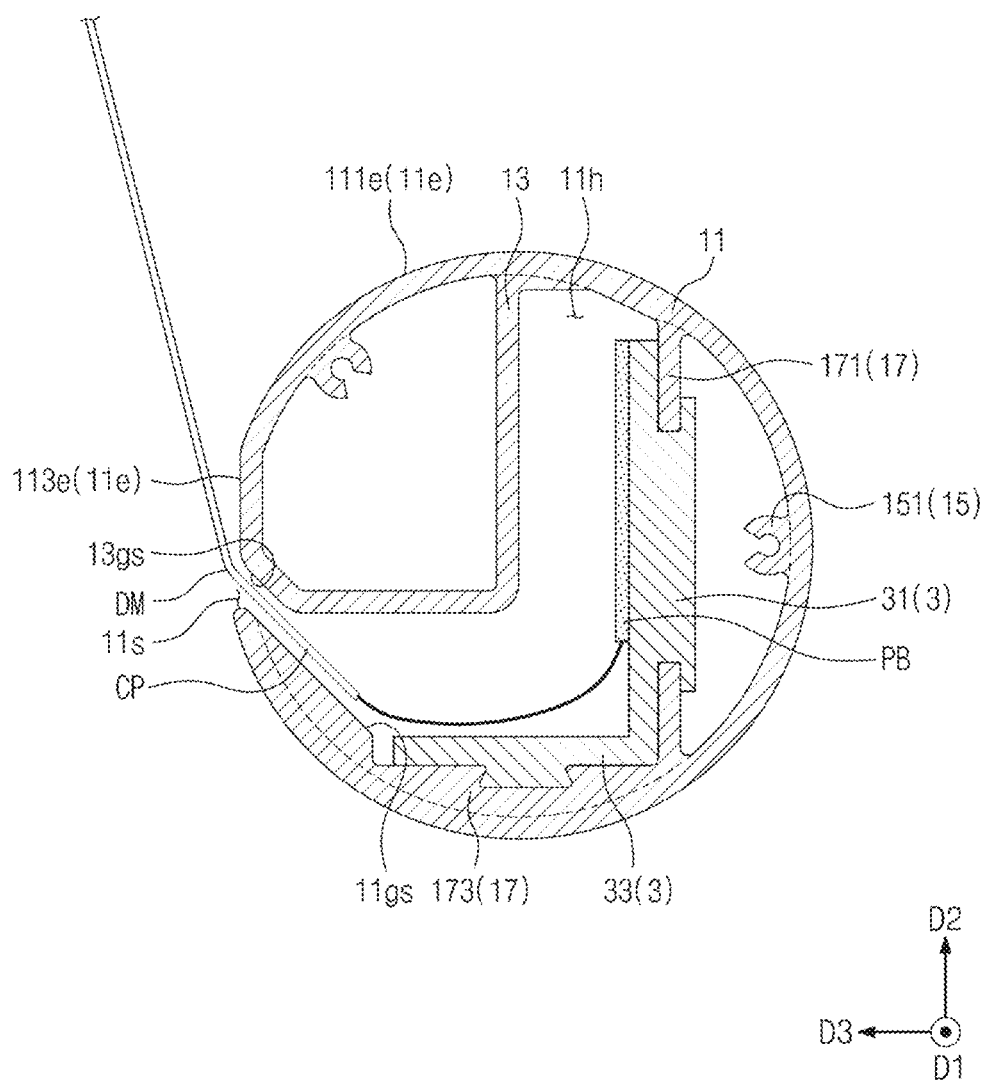
FIGS. 18 and 19 are cross-sectional views showing states of a display module rolled on a display module roller.
Figure 19:
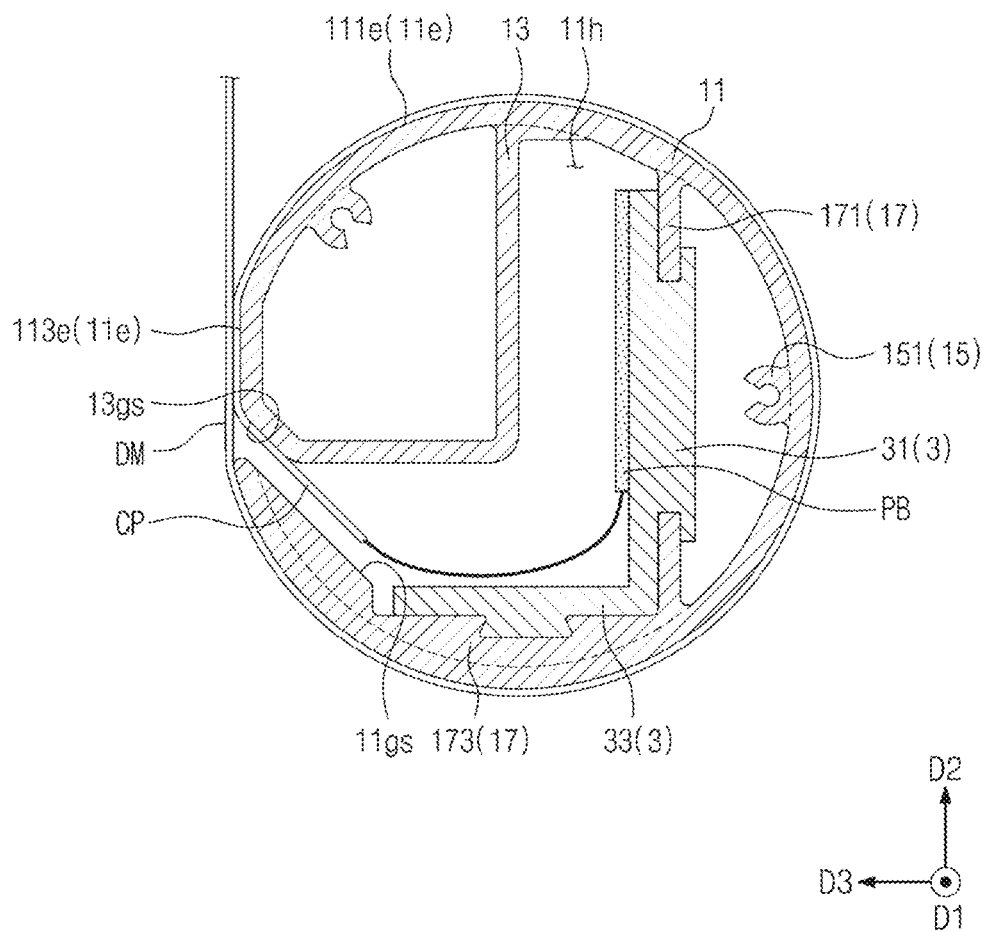

FIGS. 16 and 17 are perspective views sequentially showing the method for manufacturing a display apparatus according to the flowchart of FIG. 15, and FIGS. 18 and 19 are cross-sectional views showing states of a display module rolled on a display module roller.

Referring to FIGS. 11 and 15, the preparing (S1) of the display module roller may include manufacturing the roller 1. The roller 1 may be made such that there is no hole other than the slot 11s in the outer surface 11e. In an embodiment, the roller 1 may be manufactured through an extrusion process, for example. That is, by a die having the cross-section as in FIG. 12, the roller 1 may be drawn through the extrusion process. The roller 1 may include metal and/or plastic. However, the invention is not limited thereto, and the roller 1 may be made such that there is no hole other than the slot 11s in the outer surface 11e by a process other than the extrusion process. The insertion block 3 (refer to FIG. 13) and the cap 5 (refer to FIG. 14) may also be made through an extrusion process. In an alternative embodiment, the cap 5 may be made through injection molding and/or a cutting process rather than an extrusion process.

Referring to FIGS. 16 and 15, the coupling (S21) of the display module to the insertion block may include coupling a display module DM to an insertion block 3. In an embodiment, a driving board PB is coupled to the insertion block 3, and the display module DM is connected to the driving board PB, for example. Accordingly, the display module DM may be coupled to the insertion block 3 via the driving board PB. The driving board PB may include a printed circuit board or the like, but the invention is not limited thereto. The driving board PB may be coupled onto a first block 31. In an embodiment, the driving board PB may be coupled to the first block 31 by a separate adhesive or the like, for example. However, the invention is not limited thereto, and the driving board PB may be coupled onto a second block 33. The display module DM may be connected to the driving board PB through a connection cable CP. In an embodiment, the display module DM may be physically connected to the driving board PB through the connection cable CP, and the display module DM may be electrically connected to the driving board PB through the connection cable CP, for example. The connection cable CP may be a flexible cable. That is, the connection cable CP may be changed in shape together with the display module DM by an external force. However, the invention is not limited thereto, and the display module DM may be connected to the driving board PB without the connection cable CP.

Referring to FIGS. 17 and 16, the inserting (S22) of the insertion block into the roller may include moving the insertion block 3 in the horizontal direction and inserting the insertion block 3 into an inner accommodation space 11h. More specifically, the insertion block 3, to which the driving board PB and the display module DM are coupled, moves in the opposite direction to the first direction D1 and may be slidably inserted into the inner accommodation space 11h through a side exposure hole 11se. Here, the display module DM may be inserted into a slot 11s.

That is, when the insertion block 3 is inserted into the inner accommodation space 11h through the side exposure hole 11se, a portion of the display module DM coupled to the insertion block 3 may be inserted into the slot 11s. Subsequently, a cap 5 is coupled to the roller 1, and thus, the inner accommodation space 11h may be closed. After the cap 5 is coupled, the cap 5 may be fixed to the roller 1 by inserting screws (not shown) into the extension screw insertion groove 51ha (refer to FIG. 14) and the screw insertion groove (refer to FIG. 12). The insertion block 3 may be fixed to a predetermined position inside the roller 1 by the cap 5.

Referring to FIG. 18, in a state in which the insertion block 3 is inserted into the inner accommodation space 11h, the first block 31 may be coupled and fixed to a first coupling block 171. Also, the second block 33 may be coupled and fixed to a second coupling block 173. The connection cable CP may connect the driving board PB to the display module DM. A portion of the display module DM may be disposed in the inner accommodation space 11h. Also, another portion of the display module DM may be disposed inside the slot 11s. The other portion of the display module DM may be disposed in the outside of a cylinder body 11 of the roller 1.

Referring to FIGS. 15, 2, and 3 again, the coupling (S3) of the display module roller to the housing may include coupling the display module roller RL to the housing HS so that the display module roller RL is connected to the roller driving device RA. Subsequently, the upper end of the display module DM may be coupled to the upper side of the raising/lowering driving device EP. In an alternative embodiment, unlike those illustrated in FIG. 17, the upper end of the display module DM may be already coupled to the raising/lowering driving device EP before the display module DM is inserted into the roller 1 (refer to FIG. 18).

Referring to FIG. 19, the display module DM may be wound on an outer surface 11e of the cylinder body 11. A portion of the display module DM may contact at least a portion of an inner guide surface 13gs. Also, a portion of the display module DM may contact at least a portion of a guide surface 113e. A portion of the display module DM may contact at least a portion of a support surface 111e. A portion of the display module DM may be wound on the cylinder body 11 while overlapping with each other in the form of a plurality of layers.

In the display apparatus and the method for manufacturing same in the embodiments of the invention, there may be no discontinuities on the outer surface other than the slot in the cylinder body. That is, the roller is unitary through the extrusion process or the like, and thus, there may be no stepped portion other than the slot. Thus, it is possible to prevent stress from concentrating when the display module wound on the outer surface of the cylinder body contacts the stepped portion on the outer surface. When stress is concentrated on one side of the display module, the display module may be damaged. According to the embodiment of the invention, it is possible to prevent the display module from being damaged by preventing a stress concentration phenomenon on the surface of the display module. Thus, the quality of the display module may be enhanced, and the lifespan thereof may be increased.

In the display apparatus and the method for manufacturing same in the embodiments of the invention, the roller may be unitary through the extrusion process or the like. Thus, the entire manufacturing processes may be performed relatively simply and rapidly.

In the display apparatus and the method for manufacturing same in the embodiments of the invention, the display apparatus escaping from the slot may contact the guide surface. The display module may go through the guide surface and be wound one or more turns on the cylinder body along the support surface. The display module wound one turn on the cylinder body may contact the display module that has been in contact with the guide surface. Here, the guide surface extended to or from the slot may be recessed further inward than the support surface. Thus, it is possible to prevent the display module disposed on the display module that has been in contact with the guide surface from convexly protruding upward while forming a stepped portion. Accordingly, it is possible to prevent the display module from being damaged due to the stress concentrated on the one side thereof.

According to the display apparatus of the embodiment of the invention and the method for manufacturing same, it is possible to prevent the display module from being damaged due to the stress concentrated on one side thereof, thereby enhancing product qualities.

According to the display apparatus of the embodiment of the invention and the method for manufacturing same, the manufacturing processes may be performed simply and rapidly.

Although described with reference to the embodiments of the invention, it will be understood that various changes and modifications of the invention may be made by one skilled in the art or one having ordinary knowledge in the art without departing from the spirit and technical field of the invention as hereinafter claimed. Hence, the technical scope of the invention is to be determined by the following claims, and should not be limited by the foregoing description.

What is claimed is:

1. A display apparatus comprising:
    a roller extending in a first direction and comprising:
        a cylinder body in which an inner accommodation space is defined, the cylinder body defining a slot which exposes the inner accommodation space to an outside, and comprising an outer surface comprising:
            a support surface spaced apart from an axis of the cylinder body by a first distance; and
            a guide surface extended to or from the support surface and recessed a predetermined distance toward the axis such that a distance to the axis is less than the first distance; and
    a display module coupled to the roller,
    wherein
    the guide surface is extended to or from a first end of the slot, and
    the roller further comprises an inner support plate which is extended to or from an inner surface of the cylinder body and divides the inner accommodation space,
    the inner support plate comprises an inner guide surface extended to or from the guide surface, the inner guide surface defining the slot upon which the display module is supported thereby inside the inner accommodation space.

2. The display apparatus of claim 1, wherein the guide surface has a flat surface shape parallel to the first direction.

3. The display apparatus of claim 2, wherein a distance between the guide surface and the axis is a second distance, and
    a difference between the first distance and the second distance is about 300 micrometers to about 700 micrometers.

4. The display apparatus of claim 1, wherein the inner guide surface has a flat surface shape parallel to the first direction, and
    among dihedral angles between the inner guide surface and the guide surface, an angle directed toward the inner accommodation space is about 90 degrees or more.

5. The display apparatus of claim 1, wherein a portion of the display module contacts at least a portion of the guide surface.

6. The display apparatus of claim 1, wherein the support surface extends from the guide surface in a circumferential direction and is extended to or from a second end of the slot opposite to the first end of the slot,
wherein the support surface is provided continuously from the guide surface to the slot.

7. The display apparatus of claim 1, wherein the roller further comprises an inner coupling block which is extended to or from an inner surface of the cylinder body and disposed in the inner accommodation space, and
the inner coupling block extends in the first direction along the cylinder body.

8. The display apparatus of claim 7, further comprising an insertion block which is inserted into the inner accommodation space and connected to the display module,
wherein the insertion block is coupled and fixed to the inner coupling block.

9. A display apparatus comprising:
a roller extending in a first direction and comprising a cylinder body in which an inner accommodation space is defined, the cylinder body defining a slot which exposes the inner accommodation space to an outside and extends in the first direction and comprising an outer surface extending from a first end of the slot in a circumferential direction and is extended to or from a second end of the slot opposite to the first end of the slot; and
a display module connected to the roller,
wherein the outer surface of the cylinder body is provided continuously from the first end of the slot to the second end of the slot, and
a portion of the display module is inserted into the slot,
wherein the roller further comprises an inner support plate which is extended to or from an inner surface of the cylinder body and divides the inner accommodation space,
wherein the inner support plate comprises an inner guide surface disposed in the inner accommodation space,
a portion of the display module contacts the inner guide surface,
wherein the outer surface of the cylinder body comprises:
a support surface spaced apart from an axis of the cylinder body by a first distance; and
a guide surface extended to or from the support surface and recessed a predetermined distance toward the axis such that a distance to the axis is less than the first distance, and
wherein the display module is disposed in the inner accommodation space to define an acute angle with the axis.

10. The display apparatus of claim 9, wherein the roller defines a side exposure hole which is provided in a side surface of the roller and exposes the inner accommodation space,
wherein the slot is extended to or from the side exposure hole.

11. The display apparatus of claim 9,
wherein the guide surface is extended to or from the first end of the slot,
the inner surface is extended to or from the guide surface, and
the support surface is extended to or from the second end of the slot.

12. The display apparatus of claim 11, wherein the guide surface has a flat surface shape parallel to the first direction.

13. The display apparatus of claim 12, wherein a distance between the guide surface and the axis is a second distance, and
a difference between the first distance and the second distance is equal to a thickness of the display module.

14. The display apparatus of claim 9, further comprising an insertion block inserted into the inner accommodation space,
wherein the display module is connected to the insertion block.

15. The display apparatus of claim 9,
further comprising a cap coupled to a side surface of the roller,
wherein the roller further comprises an inner screw fastening block which is extended to or from an inner surface of the cylinder body,
wherein the inner screw fastening block defines a screw insertion groove into which a screw is inserted, and
the cap comprises a cap body,
wherein the cap body defines an extension screw insertion groove which is extended to or from the screw insertion groove.

* * * * *